United States Patent
Achir

(10) Patent No.: US 8,532,143 B2
(45) Date of Patent: Sep. 10, 2013

(54) METHOD AND DEVICE FOR DECODING, CORRESPONDING COMPUTER PROGRAM PRODUCT, STORAGE MEANS AND DESTINATION NODE

(75) Inventor: Mounir Achir, Cesson-Sevigne (FR)

(73) Assignee: Canon Kabushikia Kiasha, Tokyo (JP)

(*) Notice: Subject to any disclaimer, the term of this patent is extended or adjusted under 35 U.S.C. 154(b) by 335 days.

(21) Appl. No.: 12/940,243

(22) Filed: Nov. 5, 2010

(65) Prior Publication Data

US 2011/0103402 A1 May 5, 2011

(30) Foreign Application Priority Data

Nov. 5, 2009 (FR) ...................................... 09 57844

(51) Int. Cl.
*H04J 3/24* (2006.01)
(52) U.S. Cl.
USPC ............................. 370/474; 370/252; 370/340
(58) Field of Classification Search
USPC ........................................ 370/474, 252, 340
See application file for complete search history.

(56) References Cited

U.S. PATENT DOCUMENTS

| | | | | | |
|---|---|---|---|---|---|
| 5,828,412 | A | * | 10/1998 | Fautier et al. ............ | 375/240.12 |
| 6,597,988 | B1 | * | 7/2003 | Brodie et al. ................. | 701/469 |
| 6,873,609 | B1 | * | 3/2005 | Jones et al. .................... | 370/329 |
| 7,251,562 | B1 | * | 7/2007 | Brodie et al. ................. | 701/469 |
| 7,778,978 | B2 | * | 8/2010 | Chindapol et al. ............ | 707/690 |
| 7,864,722 | B2 | * | 1/2011 | Yi et al. ......................... | 370/312 |
| 7,983,246 | B2 | * | 7/2011 | Lee ................................ | 370/352 |
| 8,036,240 | B2 | * | 10/2011 | Hassan .......................... | 370/419 |
| 8,116,242 | B2 | * | 2/2012 | Thomas et al. ................ | 370/310 |
| 8,225,168 | B2 | * | 7/2012 | Yu et al. ......................... | 714/752 |

(Continued)

FOREIGN PATENT DOCUMENTS

EP 1 729 435 A1 12/2006

OTHER PUBLICATIONS

A. Darabiha, et al., "A Bit-Serial Approximate Min-Sum LDPC Decoder and FPGA Implementation", in Proc. of IEEE Int'l Symposium on Circuits and Systems (ISCAS), Island of Kos, Greece (2006).

(Continued)

*Primary Examiner* — Hassan Kizou
*Assistant Examiner* — Abdullahi Ahmed
(74) *Attorney, Agent, or Firm* — Fitzpatrick, Cella, Harper & Scinto

(57) ABSTRACT

A method is proposed for decoding a plurality of data packets received through a meshed communications network for the retrieval of source packets transmitted by one or more source nodes, the meshed communications network comprising relay nodes generating combined packets, each combined packet consisting of a linear combination of source packets. During the decoding by a destination node, this method consists in performing two decoding operations of which the first is a decoding by group of packets and the second is a decoding that takes account of pieces of likelihood information resulting from the first decoding. The fact of first of all carrying out a decoding with groups of packets makes it possible to exploit the repetitions (or redundancies) of packets in a meshed network to optimize the bit error rate during the decoding of source data transmitted on the communications network.

11 Claims, 7 Drawing Sheets

(56) References Cited

U.S. PATENT DOCUMENTS

| | | | |
|---|---|---|---|
| 2006/0291440 A1* | 12/2006 | Hausl et al. | 370/340 |
| 2009/0135717 A1* | 5/2009 | Kamal et al. | 370/225 |
| 2009/0252146 A1 | 10/2009 | Luo et al. | 370/351 |
| 2010/0285790 A1* | 11/2010 | Baliosian et al. | 455/422.1 |
| 2010/0296464 A1* | 11/2010 | Barraclough et al. | 370/329 |
| 2010/0309881 A1* | 12/2010 | Kim et al. | 370/331 |
| 2011/0019565 A1* | 1/2011 | Nezou et al. | 370/252 |
| 2011/0038280 A1* | 2/2011 | Jung et al. | 370/254 |
| 2011/0038431 A1* | 2/2011 | Frederiksen et al. | 375/259 |
| 2011/0064021 A1* | 3/2011 | Patini | 370/328 |
| 2011/0170480 A1* | 7/2011 | Pi et al. | 370/328 |
| 2012/0028684 A1* | 2/2012 | Miyoshi et al. | 455/561 |
| 2012/0033643 A1* | 2/2012 | Noh et al. | 370/335 |

OTHER PUBLICATIONS

G. Zeitler, et al., "Design of Network Coding Functions in Multihop Relay Networks", in Proceedings of the 5$^{th}$ IEEE Int'l Symposium Turbo Codes and Related Topics, Sep. 1, 2008, pp. 249-254.

S. Yang, et al., "Network Coding over a Noisy Relay: a Belief Propagation Approach", in Proceedings of IEEE Int'l Symposium on Information Theory, Jun. 24, 2007, pp. 801-804.

S.J. Johnson, et al., "Joint Network and Channel Coding for Cooperative Networks", Proceedings of the 2007 Australasian Telecommunications Networks and Applications Conference, Dec. 2-5, 2007, pp. 435-440.

A. Darabiha, et al., "A Bit-Serial Approximate Min-Sum LDPC Decoder and FPGA Implementation", 2006 IEEE International Symposium on Circuits and Systems, May 21-24, 2006, pp. 149-152.

* cited by examiner

METHOD AND DEVICE FOR DECODING, CORRESPONDING COMPUTER PROGRAM PRODUCT, STORAGE MEANS AND DESTINATION NODE

BACKGROUND

1. Field of the Disclosure

The field of the disclosure is that of communications networks. More specifically, the disclosure can be applied in the context of a communications network in which each data packet coming from a source node is encoded, for example with an LDPC (low density parity check) type encoding, i.e. a code for which the parity check matrix is of low density), and is then decoded by a destination node.

2. Related Art

Here below in this document, the disclosure will focus more particularly on a description of the problems and issues existing in the decoding of source data packets encoded according to an LDPC type encoding in a meshed communications network, which the inventors of the present patent application have had to cope with. Naturally, the disclosure is not limited to this particular field of application.

FIG. 1 is a schematic illustration of a wireless meshed network formed by a source node 101, several relay nodes (101, 102, 103, 104, 105) and a destination node 106.

Clearly, a meshed network of this kind may comprise several source nodes 101 and several destination nodes 106.

The description here below will be situated by way of an illustrative example in a case where the data packets sent out by the source node 101 are encoded source packets b1 and b2 resulting from an LDPC type channel encoding.

In FIG. 1, the encoded source packets b1 and b2 are relayed by the relay nodes 101 to 105.

Classically, the encoded source packets b1 and b2 may be either relayed as such (i.e. without combination with other data packets), as is the case with the relay nodes 102 and 103 in the example of FIG. 1, or combined with other data packets as is the case for example with the relay nodes 104 and 105 in the example of FIG. 1.

A relay node may therefore:
either combine data packets received at input and then transmit a combined data packet, for example a linear combination of the data packets received at input. This case, the relay node is called a "combinant relay node";
or simply relay data packets received at input without creating a combination between data packets. In this case, the relay node is called a "non-combinant relay node".

It must be noted that a packet received at input of a relay node may be either an encoded source packet (b1 or b2) or a linear combination of encoded source packets.

In the example of FIG. 1, the destination node 106 receives four packets:
two packets y1 and y2 not combined by the non-combinant relay nodes 102 and 103 respectively, and
two combined packets Pc and Pc', each resulting from a same linear combination of the encoded source packets b1 and b2. This linear combination (b1+b2) is made by the combinant relay node 104 for the combined packet Pc and by the combinant relay node 105 for the combined packet Pc').

A description shall now be given of a prior art technique currently used in the above-mentioned context, i.e. a meshed network comprising a destination node which must perform a decoding on the basis of several received packets, for which certain packets (known as combined packets) result from a same linear combination.

Once the set of data packets has been received at its input, the destination node 106 applies an LDPC decoding to each data packet received. Each decoding is done with a parity check matrix for the LDPC decoding on an input vector formed by the four received packets: y1, y2, Pc and Pc'.

If the LDPC decoding converges towards a correct solution, the destination node retrieves the originally sent source data packets.

Such a convergence of an LDPC decoding is obtained when the rows and the columns of the decoding parity check matrix built at the destination node 106 are mutually independent, i.e. when the parity check matrix has no cycles. Indeed, these cycles are present when the rows or columns of the parity matrix have a certain correlation or resemblance with one another.

The cycles in question are determined from a representation in the form of a graph of an LDPC parity matrix. These graphs link the nodes of variables (which correspond to the bits of each LDPC code word) and parity variables (which correspond to the parity bits in an LDPC code word)

A cycle in a graph is a path on the graph that makes it possible to go out from a node and return to this same node without passing through the same branch. The size of a cycle is given by the number of branches contained within the cycle. The size of the shortest cycle is called a "girth". The presence of cycles in the graph impairs decoding performance because of a phenomenon of self-confirmation during the decoding.

Now, when the decoding is done from received packets which result from a same linear combination, this inevitably leads to a correlation between the rows of the parity matrix, even in the event of different errors present in each of the packets. Different errors may affect the combined packets when these packets are transmitted through different channels to the destination node.

This is the case for example in FIG. 1 where the combined packets Pc and Pc' come from a same basic combination and are therefore mutually correlated. The rows of the decoding matrix are therefore not independent of one another.

Thus, for a meshed network, the classic LDPC decoding using a parity matrix is not optimal owing to the presence of these repetitions of messages within the communications network.

SUMMARY

The disclosure, in at least one embodiment, is aimed especially at overcoming these different drawbacks of the prior art.

More specifically, it is the goal of at least one embodiment of the invention to provide the technique for optimising the bit error rate during the decoding of source data transmitted on a communications network in the above-mentioned context, i.e. in the context of a meshed network comprising a destination node that has to perform a decoding on the basis of several received packets, and of which certain packets (known as combined packets) result from a same linear combination, but is performed by at least one different combinant relay node (for each combined packet).

It is another goal of at least one embodiment of the invention to provide a technique for implementing a solution adapted to any type whatsoever of combination of data packets made by the relay nodes.

It is another goal of at least one embodiment of the invention to provide a technique by which it is not necessary to modify the encoding operations performed by the source nodes and the combining operations or relaying operations of the relay nodes.

It is another goal of at least one embodiment of the invention to provide a technique of this kind that can be used to optimise bandwidth.

It is another goal of at least one embodiment of the invention to provide a technique of this kind that is simple to implement and costs little.

One particular embodiment of the invention proposes a method for decoding a plurality of data packets received through a meshed communications network for the retrieval of source packets transmitted by one or more source nodes, the meshed communications network comprising relay nodes generating combined packets, each combined packet consisting of a linear combination of source packets.

In a remarkable way, this method is implemented by a destination node and comprises steps for:

forming groups of received packets comprising combined packets, each group comprising no more than one packet among a plurality of combined packets which consist of a same linear combination of source packets;

performing, for each group, a first decoding of the packets of said group, said first decoding being performed by a first decoder implementing a belief propagation algorithm delivering a piece of likelihood information for said group;

combining the pieces of likelihood information obtained by the first decoding performed for the different groups, to obtain a combination of pieces of likelihood information;

performing a second decoding of said combination of pieces of likelihood information, said second decoding being performed by a second decoder capable of processing pieces of likelihood information.

Thus, this particular embodiment of the invention relies on a wholly novel and inventive approach in which two consecutive decoding operations (instead of only one decoding operation as in the prior art) are performed during the decoding by the destination node, the first decoding operation of which is a decoding by groups of packets and the second of which is a decoding that takes account of likelihood information resulting from the first decoding. The fact of performing first of all one decoding with groups of packets enables the exploitation of repetitions (or redundancies) of packets in a meshed network to optimise the bit error rate during the decoding of source data transmitted on the communications network.

The present disclosure finds application more particularly in a decoding operation that implements hollow decoding matrices jointly with an application of the belief propagation algorithm so as to obtain a convergence of said decoding, for example of an LDPC type, toward an accurate solution. Indeed, through the use of groups of data packets, each first decoding is done with a small-sized decoding matrix whose rows are not mutually correlated. The bit error rate is thereby reduced during the application of the second decoding to a single vector formed out of the trust values of each group.

Thus, the present disclosure can be used to adapt to any type of combination of data packets performed by the relay nodes.

The step of combining pieces of trust information advantageously also optimises the bandwidth by averaging the pieces of trust information. This combination gives an average value of this information with a low value of standard deviation of the noise related to the communications channel.

Advantageously, each group of received packets comprises data packets corresponding to a same set of at least one source packet transmitted by said source node or nodes.

Thus, the present disclosure enables the use of smaller-sized decoding matrices and therefore reduces the computation time during the decoding of the source data by the destination node.

Advantageously, the first and second decoding operations are LDPC type operations.

The decoding is thereby improved, the belief propagation algorithm improving the decoding when the decoding matrices are hollow, which is the case for an LDPC decoding.

Advantageously, the first and second decoding operations are decodings in the logarithmic domain, the step for combining being a step of summation or weighted summation of each piece of trust information.

Thus, the computation operations are limited.

According to an advantageous characteristic, each linear combination is done by means of an "Exclusive-OR" operation.

Thus, the computation operations are simplified.

In another embodiment, the disclosure concerns a computer program product downloadable from a communications network and/or recorded on a computer-readable carrier and/or executable by a processor. This computer program product comprises program code instructions for implementing the above-mentioned method (in any of its different embodiments) when said program is executed on a computer.

In another particular embodiment, the disclosure concerns a computer-readable storage means storing a computer program comprising a set of instructions executable by a computer for implementing the above-mentioned method (in any of its different embodiments).

In another embodiment, the disclosure pertains to a destination node for decoding a plurality of data packets received through a meshed communications network for the retrieval of source packets transmitted by one or more source nodes, the meshed communications network comprising relay nodes generating combined packets, each combined packet consisting of a linear combination of source packets.

In a remarkable way, the destination node comprises:

means for forming groups of received packets comprising combined packets, each group comprising no more than one packet among the combined packets consisting of a same linear combination of source packets;

first means for decoding making it possible to perform, for each group, a first decoding of the packets of said group, said first decoding being performed by a first decoder implementing a belief propagation algorithm delivering a piece of likelihood information for said group;

means for combining the pieces of likelihood information obtained by the first decoding performed for the different groups, to obtain a combination of pieces of likelihood information;

second means for decoding to perform a second decoding of said combination of pieces of likelihood information, said second decoding being performed by a second decoder capable of processing pieces of likelihood information.

Advantageously, said destination node comprises means for selecting a same set of at least one source packet transmitted by said source node or nodes, each group of received packets comprising data packets corresponding to said same set.

Thus, at least one embodiment of the invention enables the use of smaller-sized decoding matrices and therefore reduces the computation time during the decoding of the source data by the destination node.

Advantageously, the first and second decoding operations are LDPC type operations.

Advantageously, the first and second decoding operations are decodings in the logarithmic domain, said means for combining likelihood information performing a summation or a weighted summation of each piece of trust information.

Again, each linear combination is done by means of an "Exclusive-OR" type operation.

BRIEF DESCRIPTION OF THE DRAWINGS

Other features and advantages of the disclosure shall appear from the following description, given by way of an indicative and non-restrictive example, and from the appended drawings, of which.

DETAILED DESCRIPTION

Figure 3:
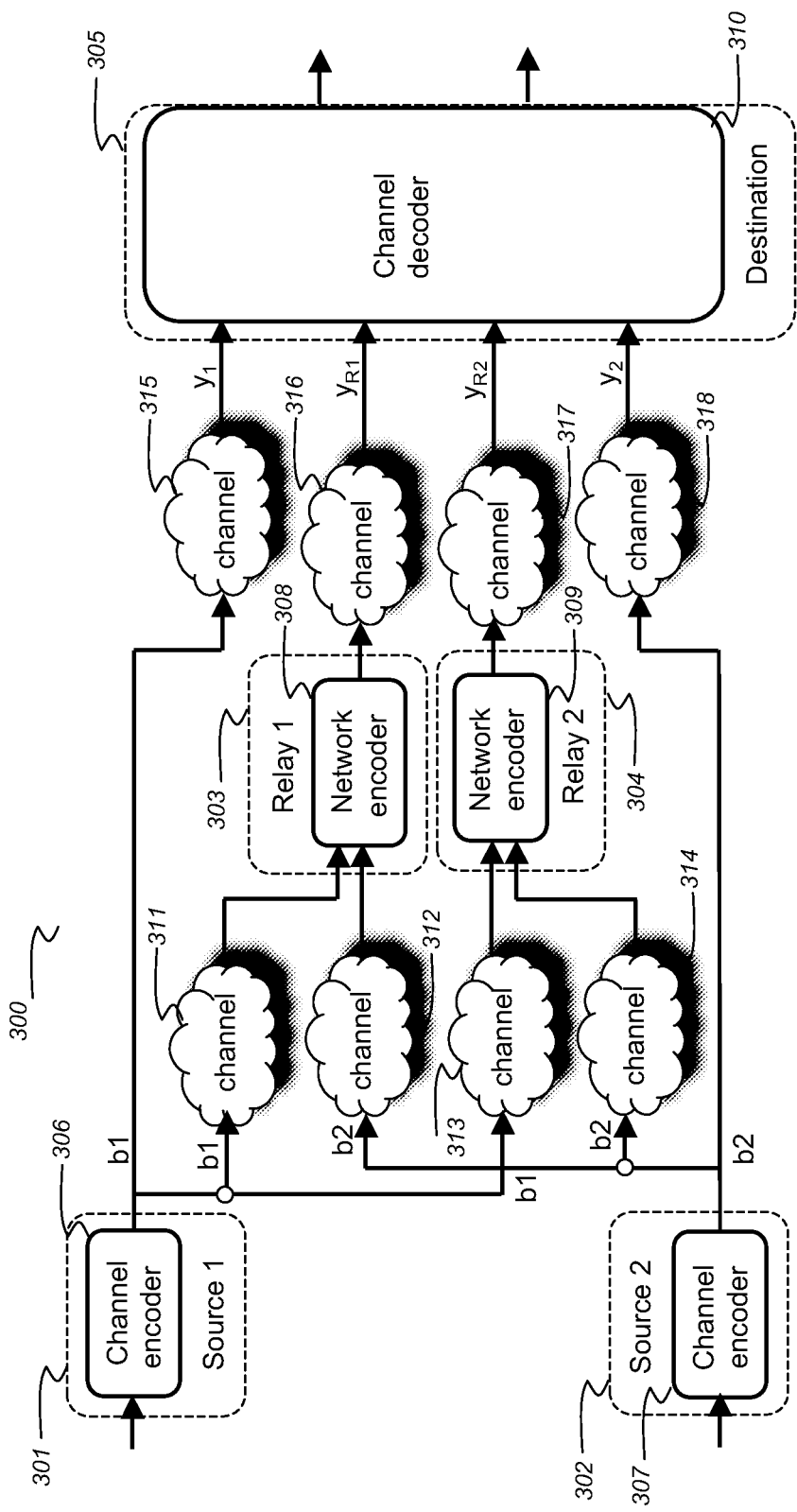
FIG. 3 is a schematic illustration of an encoding scheme in a meshed communications network comprising two source nodes, two relay nodes and one destination node, according to one particular embodiment of the invention.

FIG. 3 is a schematic illustration of an example of an encoding scheme in a meshed communications network comprising two source nodes, two relay nodes and one destination node, according to one particular embodiment of the invention.

More specifically, FIG. 3 illustrates a joint LDPC and network encoding scheme in one and the same meshed network.

Classically, a packet received at input of a relay node can be either an encoded source packet or a linear combination of encoded source packets. In the latter case, the combining operation done by the relay nodes corresponds to the network encoding.

Let us take two source nodes 301 and 302 applying an LDPC type encoding, respectively 306 and 307.

The source nodes 301 and 302 each transmit an encoded source packet respectively b1 and b2:
to each relay node 303 and 304 through communications channels 311, 312, 313 and 314;
to the destination node 305 through communication channels 315 and 318.

The destination node 305 thus directly receives the packets b1 and b2 from the source nodes 301 and 302 if it is assumed that the transmission channel is without communications errors. If we consider the transmission errors on the transmission channels, the encoded source data packets b1 and b2 respectively have corresponding data packets Y1 and Y2, i.e. the source data packets b1 and b2 affected by communications errors.

The relay nodes 303 and 304 for their part apply a linear combination of the encoded source packets b1 and b2 received at input, respectively by means of the blocks 308 and 309 in order to determine combined packets, YR1 and YR2 respectively, which will them be transmitted to the destination node 305 through the channels 316 and 317.

In one particular embodiment of the invention, the combination of the packets by the relay nodes 303 and 304 can be performed by a simple "Exclusive-OR" (commonly abbreviated as "XOR") addition on all the bits of the packets to be combined.

A description shall now be made of a combination of received packets at input of a relay node (for example the relay node 303 of FIG. 3). These packet may be either encoded source packets b1 and b2 that are not modified or linear combinations of the source packets b1 and b2.

Let us take two source packets sized 10 bits each:
a packet b1=[1 0 0 1 0 0 1 1 0 0] and;
a packet b2=[0 1 0 1 1 0 1 0 0 0].

The resulting combined packet is then written (using the "Exclusive-OR" operation) as: b1XOR b2=[1 1 0 0 1 0 0 1 0 0].

An identical form of reasoning is applied to the relay node 304 in FIG. 3.

The non-combined packets Y1, Y2 correspond to the source data packets b1 and b2 received directly from the source nodes 301 and 302 respectively and possibly affected by transmission errors owing to the fact that a communications channel of a network is subject to communications errors during data transmission.

The combined packets YR1 and YR2 for their part correspond to the combinations of encoded source data packets b1 and b2 or else to combinations of data packets Y1, Y2 possibly affected by errors. These two combined packets YR1 and YR2 come respectively from the relay nodes 303 and 304.

The destination node 305 of FIG. 3 therefore receives four packets (in the example of FIG. 3): Y1, Y2, YR1 and YR2. These packets are then decoded by this destination node by means of a joint network and LDPC decoding on the basis of the four received packets and a parity matrix HH (or decoding matrix).

We shall now describe an example of computation of the parity matrix HH.

Let H be the parity matrix used to encode messages at the source nodes 301 and 302. The packets transmitted by the source nodes are formed by blocks. Each of these blocks is an LDPC code word denoted as b1 (for the source node 301) and b2 (for the source node 302). These last two packets satisfy the following two equations:

$$H \cdot b_1^T = 0$$

$$H \cdot b_2^T = 0$$

Each of the relay nodes 303 and 304 (in the example of FIG. 3) for its part computes a combined packet b3=b1 XOR b2. A comprehensive parity matrix can thus be determined as a function of the parity matrix H and the relationship between b3, b2 and b1. The comprehensive parity matrix is written as followed:

$$HH = \begin{pmatrix} H & zeros(K,N) & zeros(K,N) \\ zeros(K,N) & H & zeros(K,N) \\ I(N,N) & I(N,N) & I(N,N) \end{pmatrix} \quad (1)$$

With: N being the size of the LDPC code word;
K the number of parity bits of an LDPC code word;
zeros(K,N) represents a matrix with zero elements, sized K×N;
I(N,N) represents an identity matrix N×N.

Figure 4:
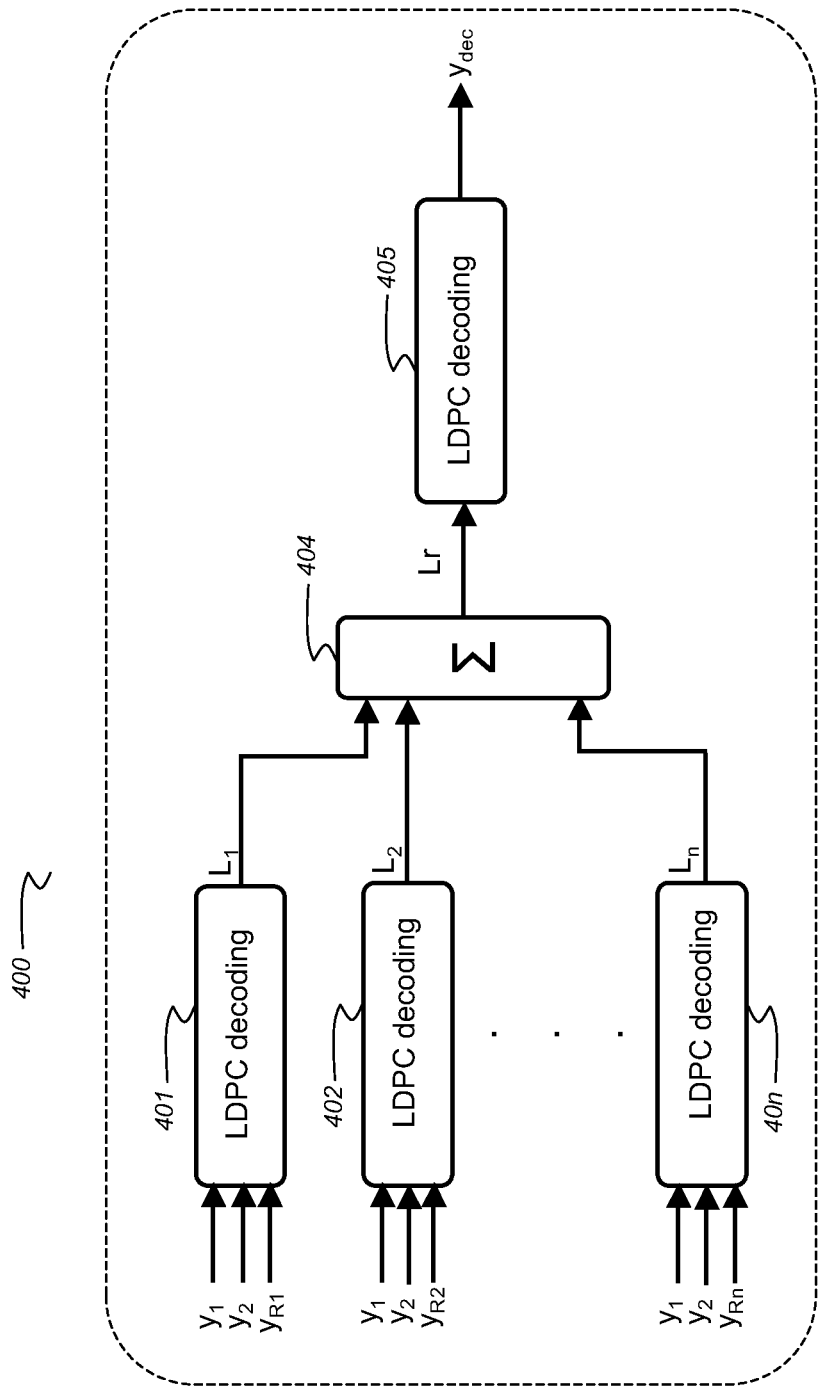
FIG. 4 is a schematic illustration of an architecture of a decoder of a destination node, according to one particular embodiment of the invention.

FIG. 4 is a schematic illustration of an architecture of a joint LDPC and network decoder 400 according to a particular embodiment for a meshed network comprising at least two relay nodes and two source nodes (corresponding to the two source nodes 301 and 302 in FIG. 3). This decoder 400 corresponds to the decoder 310 of the destination node 305 in FIG. 3.

According to one particular embodiment of the invention, the decoder 400 (of the destination node 305) receives at input at least two different groups of data packets, each group comprising non-combined packets identical for all the groups and a combined packet which is different from each group, each non-combined packet resulting from the transmission, by a different source node, of a different encoded source packet included in a determined set of encoded source packets, all the combined packets resulting from a same linear combination of the encoded source packets of said set, said linear combination being done by at least one different combinant relay node for each combined packet.

In the example of FIG. 4, the decoder 400 (of the destination node 305) inputs N different groups of data packets, each group being a triplet of packets comprising the two non-combined packets Y1 and Y2 coming from the source nodes and a combined packet YRi (with i ranging from 1 to n) coming from a relay node i, the destination node receiving n combined packets coming from n relay nodes of the set of relay nodes of the meshed network.

According to one particular embodiment of the invention, on all the triplets of packets (Y1, Y2, YRn) a first LDPC decoding is applied, this encoding being performed respectively by first LDPC decoders 401, 402 . . . 40n. Each first LDPC decoding is done using the corresponding triplet of packets and the matrix HH with application of a Tanner graph and the steps of a "belief propagation" algorithm.

A brief description shall now be provided of the way in which a Tanner graph is built as well as the different steps implemented during the execution of a "belief propragation" algorithm to carry out a decoding better known as a "decoding on graphs".

A code may be defined as a set of variables which meet a set of constraints. A graph can then be built so as to represent these relationships between variables and constraints.

Figure 1:
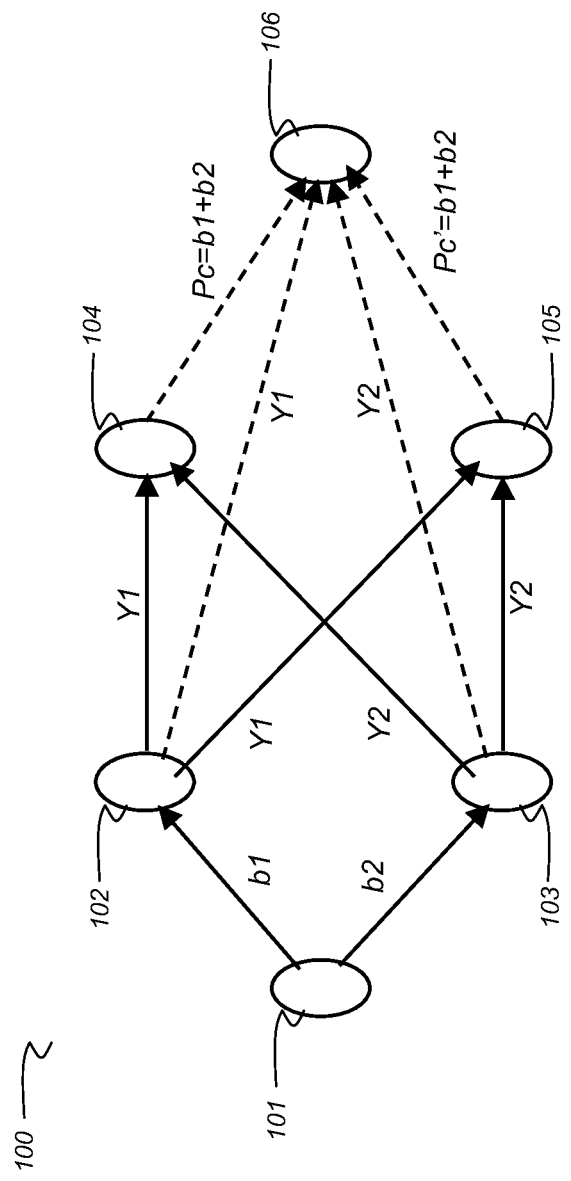
FIG. 1 (described with reference to the prior art) is a schematic illustration of a classic example of a wireless meshed communications network with multiple paths comprising a source node, a destination node and relay nodes.
Figure 2:
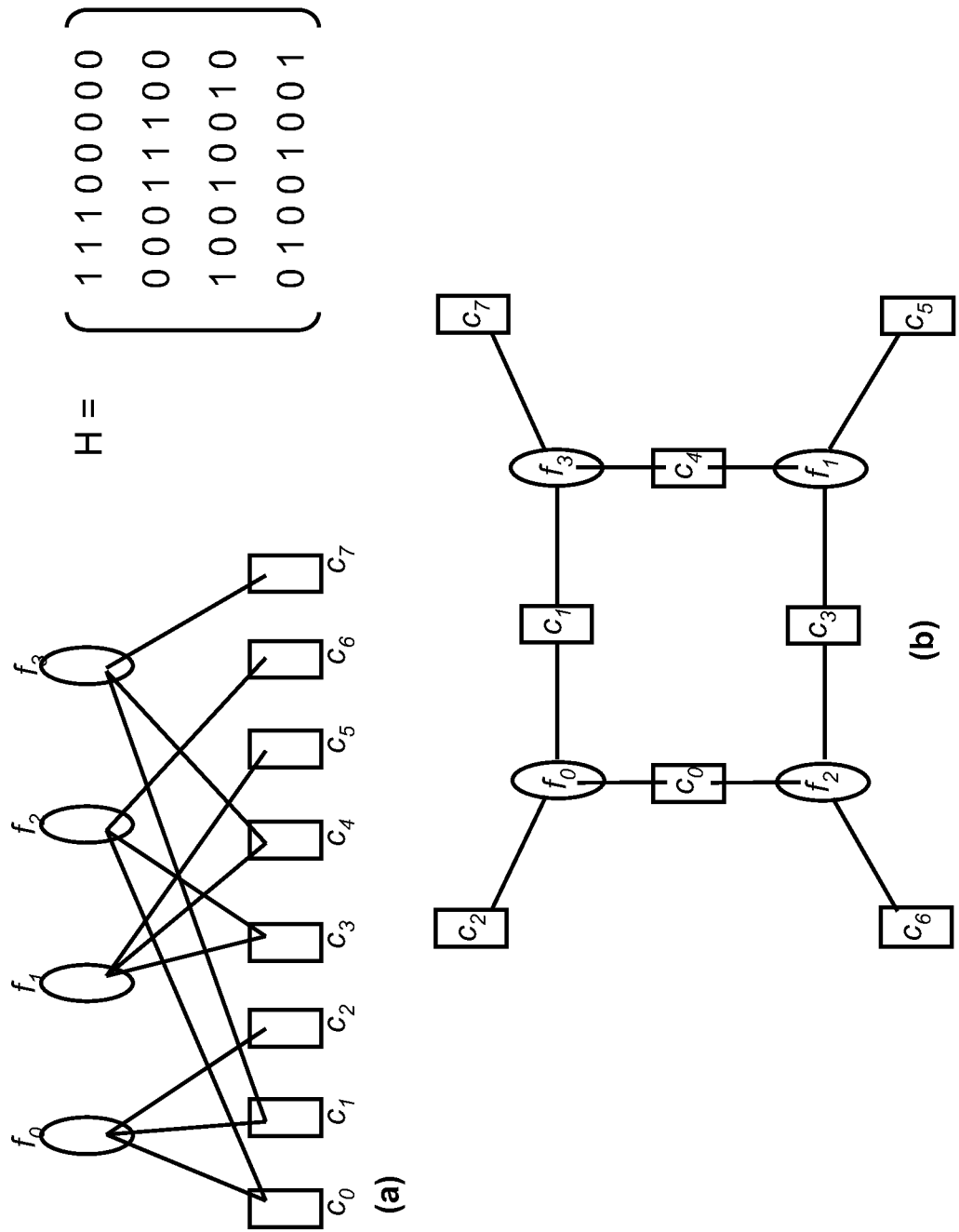
FIG. 2 is a schematic illustration of a Tanner graph (a) and a graph (b) organised with a view to graph decoding.

FIG. 2 provides a schematic illustration of a graph of this kind in which a variable is represented by a square and a constrain by a circle.

Let C be the code on the Galois field of the binary elements or bits defined by the parity check matrix H.

$$H = \begin{bmatrix} 1 & 1 & 1 & 0 & 0 & 0 & 0 & 0 \\ 0 & 0 & 0 & 1 & 1 & 1 & 0 & 0 \\ 1 & 0 & 0 & 1 & 0 & 0 & 1 & 0 \\ 0 & 1 & 0 & 0 & 1 & 0 & 0 & 1 \end{bmatrix}$$

The linear code C is the set of 8-uplets x={x1, x2, x3, x4, x5, x6, x7, x8} which satisfy the equation:

$$H \cdot x^t = 0.$$

Thus, checking that x belongs to the linear code C is equivalent to checking the following condition:

[x1+x2+x3=0] and;

[x4+x5+x6=0] and;

[x1+x4+x7=0] and [x2+x5+x8=0].

The constraints consist in meeting all the parities and the function associated with this constraint is the sum modulo 2.

FIG. 2 illustrates the corresponding graph in two depictions where the circle represents the sum modulo 2. This graph is better known as a Tanner graph.

This Tanner graph is used especially to set up a quantified decision decoding. Associated with each variable of the code is the value of the symbol received after transmission, this value being capable of being quantified.

An algorithm known as a "belief propagation" algorithm or "message propagation" algorithm is then set up with a graph as a support.

There are several existing versions of belief propagation algorithms.

We shall now describe the most commonly implemented version which makes use of logarithmic values and is better known as an algorithm for decoding in the logarithmic domain. Indeed, it is desirable to do the computations in the logarithmic domain because the multiplications are converted into additions, thus making the computations far less complex.

This algorithm is more amply described in Jian Sun, "An introduction to low density parity check (LDPC) codes", WCRL Seminar Series, 3 Jun. 2003.

The algorithm for decoding in the logarithmic domain can be defined as follows:

$$L(q_{ij}) = \alpha_{ij} \cdot \beta_{ij}$$

$$\alpha_{ij} = \text{sign}(L(q_{ij}))$$

$$\beta_{ij} = \text{abs}(L(q_{ij}))$$

At the initializing step:

$$L(c_i) = 2y_i/\sigma^2$$

$$L(q_{ij}) = L(c_i)$$

With:
$y_i$ the ith noisy sample received and modulated in BPSK (1 for 0 et −1 for 1))
$\sigma$ the standard deviation of the noise A first step (step 1) is a step for sending a message to a constraint node and then computing the response $L(r_{ji})$:

$$L(r_{ji}) = \phi\left(\sum_{i' \in R_{j/i}} \phi(\beta_{i'j})\right) \cdot \prod_{i' \in R_{j/i}} \alpha_{i'j}$$

With: $\phi(x) = \log\left(\dfrac{e^x + 1}{e^x - 1}\right)$

A second step (step 2) is a step for receiving the responses and computing the new message $$L(q_{ij}) = L(c_i) + \sum_{j' \in C_{i/j}} L(r_{j'i})$$

Then the steps 1 and 2 are repeated for a predefined number of iterations.

A third step (step 3) is a step for making a quantified decision on the basis of the computer logarithmic values:

$$L(Q_i) = L(c_i) + \sum_{j' \in C_i} L(r_{ji})$$

A fourth step (step four) is used to take a decision:

If $L(Qi) < 0$ then $c_i = 1$

Else $c_i = 0$

In this belief propagation algorithm, it is necessary to know the value of the standard deviation of the noise σ. This implies an estimation of the signal-to-noise ratio.

One simplification described here below enables this constraint to be overcome. However, the result of this is a less optimal decoding. This simplification is more amply described in Ahmad Darabiha, Anthony Chan Carusone and Frank R. Kschischang, "A Bit-Serial Approximate Min-Sum LDPC Decoder and FPGA Implementation", IEEE International Symposium on Circuits and Systems (ISCAS) 2006, Island of Kos, Greece.

Indeed, at initialization we may consider:

$$L(c_i) = y_i$$

Another simplification can be made when computing the expression $$\phi\left(\sum_{i' \in R_{j/i}} \phi(\beta_{i'j})\right).$$

Indeed, this term may be approximated by the expression $$\phi(\phi(\min_{i'} \beta_{i'j}))$$

which is equal to $$\min_{i'} \beta_{i'j}.$$

The expression of the step one then becomes:

$$L(r_{ji}) = \min_{i'} \beta_{i'j} \cdot \prod_{i' \in R_{j/i}} \alpha_{i'j}$$

According to one particular embodiment of the invention, each first decoder implements only the initializing steps 1, 2 and 3 of the belief propagation algorithm. Thus, each first decoding of a group (or triplet of packets y1, y2 and yRi) has, at output of each first LDPC decoder (401, 402, . . . 40n), a corresponding vector which is a vector of likelihood logarithm values respectively (L1, L2, . . . Ln). Indeed, each vector of the likelihood values Li is the concatenation of the likelihood vectors of the packets y1, y2 and yRi. These vectors Li are obtained from application of the steps 1, 2 and 3 of the belief propagation algorithm in using the matrix HH given by the equation 1. Should one of the packets y1, y2 and yRi be missing before the first decoding, the initial values of the likelihood logarithm of the missing packet are initialized with the value zero.

These computed values of likelihood logarithms (L1, L2 . . . Ln) are then added up, bit by bit, by means of an addition block 404. The result Lr generated at output of this addition block is then a vector sized 3*N if each group has three packets.

This result Lr is then used by the second LDPC decoder 405. Just like the first LDPC decoders 401, 402, . . . 40n, the second LDPC decoder 405 uses the parity matrix HH to carry out its decoding. Indeed the packets b1, b2 and b3=b1 XOR b2 meet the following equation:

$$\begin{pmatrix} H & zeros(K,N) & zeros(K,N) \\ zeros(K,N) & H & zeros(K,N) \\ I(N,N) & I(N,N) & I(N,N) \end{pmatrix} \cdot \begin{bmatrix} b1 \\ b2 \\ b1 xorb2 \end{bmatrix} = \begin{bmatrix} zeros(K,1) \\ zeros(K,1) \\ zeros(N,1) \end{bmatrix}$$

Or else again: HH·B=zeros(K+K+N,1) with B=[b1;b2;b1 xor b2]

Figure 5:
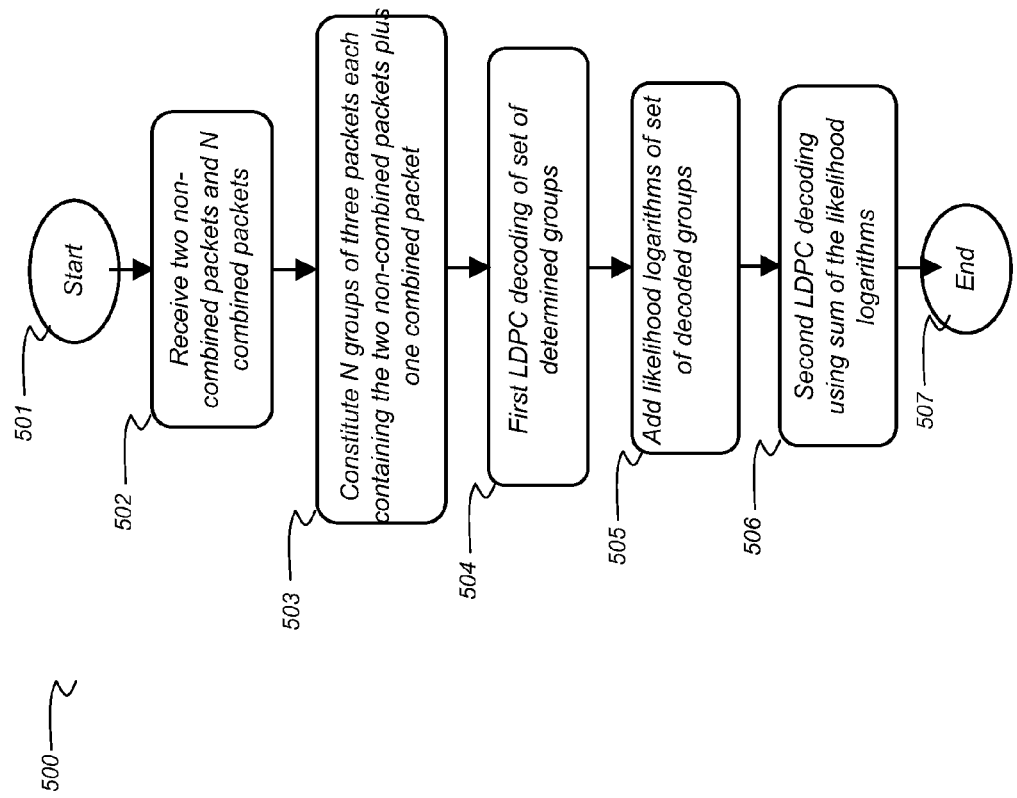
FIG. 5 is a schematic illustration of a decoding method implemented by the decoder of FIG. 4, according to one particular embodiment of the invention.

FIG. 5 provides a schematic illustration of a decoding method 500 implemented by the decoder 400 of FIG. 4, this decoder 400 being implanted at the destination node 305 (FIG. 5).

A first step 501 is a step for initializing the decoder 400.

A second step 502 enables the reception of:
of at least two non-combined data packets (i.e. transmitted directly by the source nodes 301 and 302 in the example of an architecture in FIG. 3) and;
n combined packets YR1, YR2, . . . YRn (i.e. the packets generated and transmitted by n relay nodes along the n relay nodes belonging to the meshed network).

A third step 503 then determines n groups of packets (or n triplets), each nth group (or triplet) comprising at least two non-combined packets and one combined nth packet.

Then, in a step 504, a first LDPC decoding (as explained in greater detail here-above) with application of the Tanner graph and a "belief propagation" algorithm is performed for each of the groups in order to compute a value of a likelihood logarithm Li associated with a group i among the set of groups of packets (or triplets).

This first LDPC decoding is then performed on the basis of each triplet of packets and from the matrix HH introduced here above.

A step 505 is then used for the adding up of the likelihood logarithm values by means of the addition block 404 in FIG. 4. We then obtain a sum vector Lr of the likelihood logarithms.

Then, in a step 506, a second LDPC decoding is performed using the sum vector Lr of the likelihood logarithms. This second decoding is done by the second decoder 405 of FIG. 4. This decoder, like the first decoders of the step 504, uses the parity matrix HH to perform the second decoding.

Figure 6:
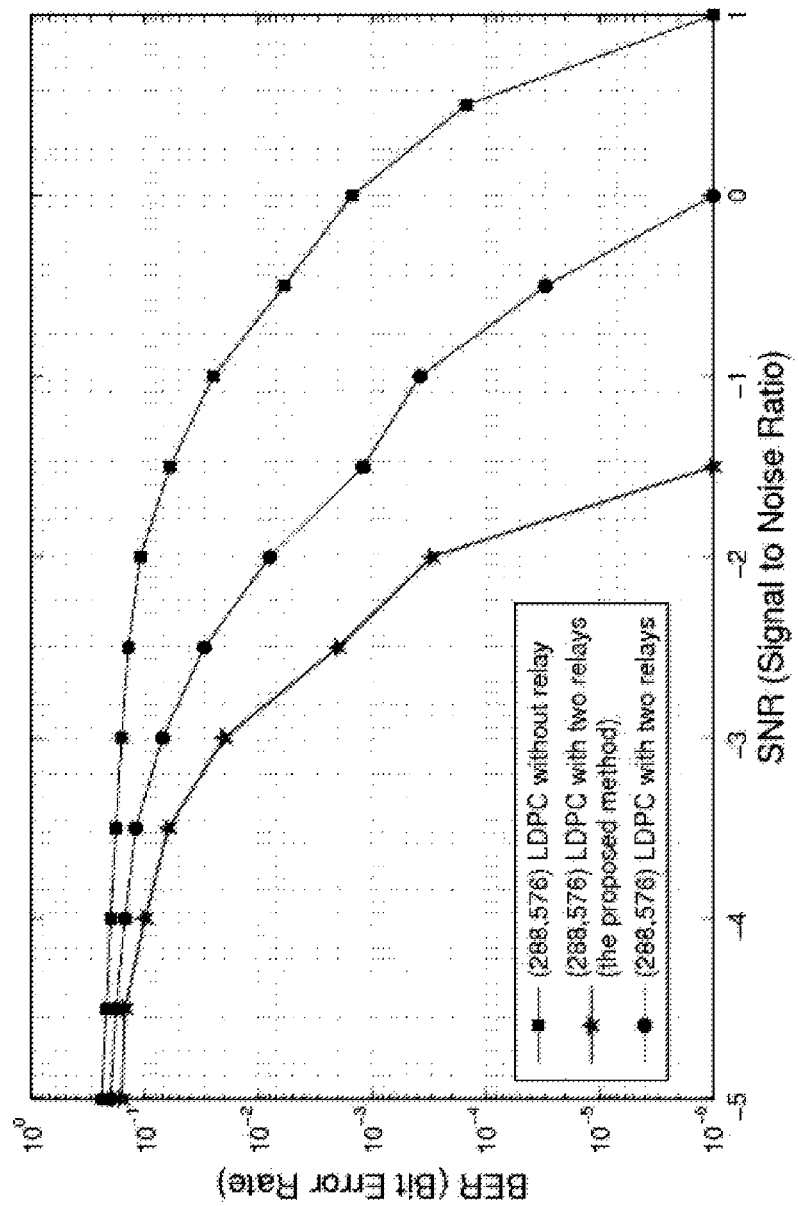
FIG. 6 illustrates a bit error rate curve as a function of the signal-to-noise ratio for a decoding without relay nodes, with two relay nodes (the classic method) and with two relay nodes according to one particular embodiment of the invention.

FIG. 6 is a schematic illustration of the graphic progress of the bit error rate or BER as a function of the signal-to-noise ratio (or SNR) for:

decoding without relay nodes (represented by squares on a curve 3);

a classic decoding with two relay nodes (represented by circles on a curve 2);

a decoding with two relay nodes (represented by stars on a curve 1), according to a particular embodiment of the present invention.

The curve of FIG. 6 clearly shows that, for a decoding with two relay nodes, the bit error rate obtained according to the method of the present invention (FIG. 5, curve 1) is smaller than that obtained with the classic method (curve 2), and that this is so for the same values of the signal-to-noise ratio.

The classic LDPC decoding, in a meshed network, of two source packets and two combined packets coming from two relay nodes corresponds to an LDPC decoding performed with the following matrix (i.e. without a first decoding with an estimation of the logarithmic values of each group of data packets, these values being then used for a second LDPC decoding).

$$HHH = \begin{pmatrix} H & zeros(K,N) & zeros(K,N) & zeros(K,N) \\ zeros(K,N) & H & zeros(K,N) & zeros(K,N) \\ I(N,N) & I(N,N) & I(N,N) & zeros(N,N) \\ I(N,N) & I(N,N) & zeros(N,N) & I(N,N) \end{pmatrix}$$

In this classic decoding, the LDPC decoding is therefore done with the matrix HHH and an input vector [Y1; Y2; YR1; YR2] (in the example of FIG. 3 with reception of two combined packets YR1 and YR2).

In this example, a correlation (or likelihood) appears between the last two rows of the matrix HHH corresponding to the rows for the decoding of the two packets coming from the two relay nodes.

In this example of a matrix, for a given configuration of a communications network, this correlation between rows is presented solely when each of the relay nodes does a same linear combination of the source data packets. As discussed here above, a decoding (for example an LDPC decoding) that is done with such a matrix presents a bit error rate that is greater than that of an ideal decoding matrix HHH for which the rows and columns would not be correlated with one another.

This correlation of rows and columns of the decoding matrix is especially sensitive for an LDPC type decoding requiring a hollow matrix, i.e. a matrix with low correlation between the rows and columns.

Again, this value of the bit error rate is appreciably lower if it is compared with the value obtained for an LDPC decoding without relay nodes (curve 3) performed with the matrix H and a packet b1.

It must be noted that the simulation has been done with a BPSK (Binary Phase Shift Keying) modulation.

Figure 7:
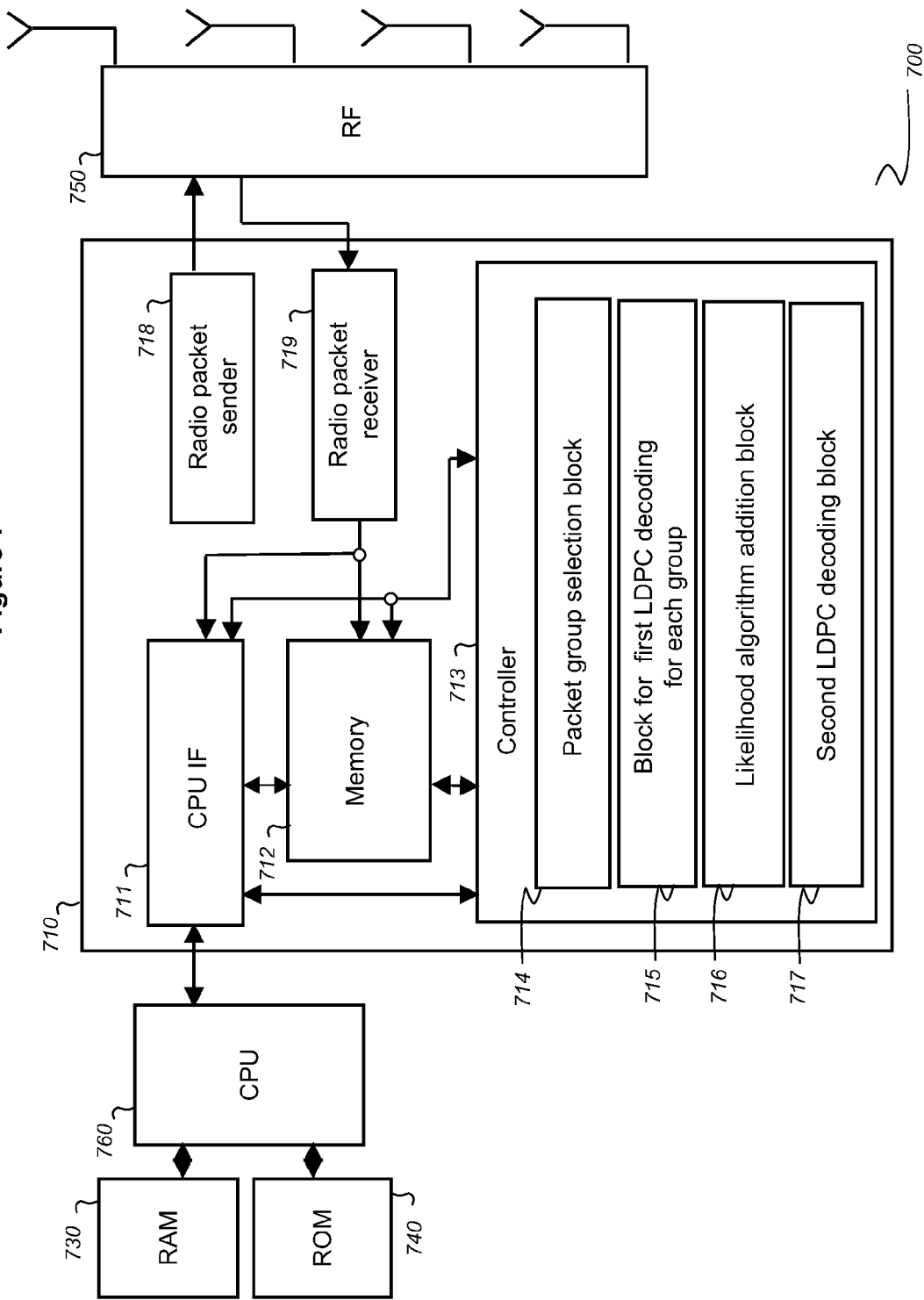
FIG. 7 is a schematic illustration of a device adapted to implementing the method of FIG. 5, according to one particular embodiment of the invention.

FIG. 7 is a schematic illustration of a communications device 700 adapted to implementing the method of FIG. 5 according to a particular embodiment.

This communication device 700 comprises:
- a block 713 used to execute the method 500 (FIG. 5). This block 713 contains the blocks 714, 715, 716 and 717 corresponding repetively to a block for selecting groups of data packets, a block implementing the first LDPC decoding for each group of packets (or triplets), a likelihood algorithm addition block and a block implementing the second LDPC decoding;
- a "CPU IF" block 711 corresponding to the interface between the CPU and the baseband part;
- a block 712 corresponding to the data memory;
- a block 718 corresponding to a data packet reception circuit;
- a block 719 corresponding to a data packet reception circuit;
- a block 730 corresponding to a random-access memory (RAM);
- a block 740 corresponding to a read-only memory (ROM);
- a block 750 corresponding to a radiofrequency transmitter;
- a block 760 corresponding to a central processing unit (CPU).

It will be noted that the disclosure is not limited to a purely software implantation in the form of a sequence of instructions of a computer program but that it can also be implemented in hardware form or any other form combining a hardware part and a software part. Should one embodiment of the invention be implanted partially or totally in software form, the corresponding sequence of instructions could be stored in a detachable storage means (such as for example a floppy, a CD-ROM or a DVD-ROM) or in a non-detachable storage means, this storage means being readable by a computer or a microprocessor.

Thus, one embodiment of the invention can be implemented equally well as a program executed:
- on a reprogrammable computation machine such as a personal computer (or PC), a digital signal processor (or DSP) or a microcontroller;
- or else again on a dedicated computation machine such as a set of logic gates, for example a field programmable gate array (FPGA) or applications specific integrated circuit (ASIC).

What is claimed is:

1. A method for decoding a plurality of data packets received through a meshed communications network for the retrieval of source packets transmitted by one or more source nodes, the meshed communications network comprising relay nodes generating combined packets, each combined packet consisting of a linear combination of source packets, the method being implemented by a destination node and wherein it comprises steps for:

forming at least two different groups of received packets, each group comprising at least two non-combined packets and at least one combined packet which is a linear combination of said at least two non-combined packets, each group comprising no more than one packet among the combined packets consisting of a same linear combination of source packets;

performing, for each group, a first decoding of the packets of said group, said first decoding being performed by a first decoder implementing a belief propagation algorithm delivering a piece of likelihood information for said group;

combining the pieces of likelihood information obtained by the first decoding performed for the different groups, to obtain a combination of pieces of likelihood information;

performing a second decoding of said combination of pieces of likelihood information, said second decoding being performed by a second decoder capable of processing pieces of likelihood information.

2. The method for decoding according to claim 1, wherein each group of received packets comprises the same set of at least one source packet.

3. The method for decoding according to claim 1, wherein the first and second decoding operations are of the Low Density Parity Check (LDPC) type.

4. The method for decoding according to claim 1, wherein the first and second decodings are decodings in the logarithmic domain and the step for combining is a step of summation or weighted summation of each piece of trust information.

5. The method for decoding according to claim 1, wherein each linear combination is done by means of an "Exclusive-OR" operation.

6. A non-transitory computer-readable storage medium storing a computer program comprising a set of instructions executable by a computer for implementing a method for decoding a plurality of data packets received through a meshed communications network for the retrieval of source packets transmitted by one or more source nodes, the meshed communications network comprising relay nodes generating combined packets, each combined packet consisting of a linear combination of source packets, the method being implemented by a destination node and wherein it comprises steps for:
   forming at least two different groups of received packets, each group comprising at least two non-combined packets and at least one combined packet which is a linear combination of said at least two non-combined packets, each group comprising no more than one packet among the combined packets consisting of a same linear combination of source packets;
   performing, for each group, a first decoding of the packets of said group, said first decoding being performed by a first decoder implementing a belief propagation algorithm delivering a piece of likelihood information for said group;
   combining the pieces of likelihood information obtained by the first decoding performed for the different groups, to obtain a combination of pieces of likelihood information;
   performing a second decoding of said combination of pieces of likelihood information, said second decoding being performed by a second decoder capable of processing pieces of likelihood information.

7. A destination node for decoding a plurality of data packets received through a meshed communications network for the retrieval of source packets transmitted by one or more source nodes, the meshed communications network comprising relay nodes generating combined packets, each combined packet consisting of a linear combination of source packets, said destination node being characterized in that it comprises:
   means for forming at least two different groups of received packets, each group comprising at least two non-combined packets and at least one combined packet which is a linear combination of said at least two non-combined packets, each group comprising no more than one packet among the combined packets consisting of a same linear combination of source packets;
   first means for decoding making it possible to perform, for each group, a first decoding of the packets of said group, said first decoding being performed by a first decoder implementing a belief propagation algorithm delivering a piece of likelihood information for said group;
   means for combining the pieces of likelihood information obtained by the first decoding performed for the different groups, to obtain a combination of pieces of likelihood information;
   second means for decoding to perform a second decoding of said combination of pieces of likelihood information, said second decoding being performed by a second decoder capable of processing pieces of likelihood information.

8. The destination node according to claim 7, wherein it comprises means for selecting a same set of at least one source packet transmitted by said source node or nodes, each group of received packets comprising the same set of at least one source packet.

9. The destination node according to claim 7 wherein the first and second decoders perform Low Density Parity Check (LDPC) type operations.

10. The destination node according to claim 7 wherein the first and second decoders operate in the logarithmic domain and in that said means for combining pieces of likelihood information perform a summation or a weighted summation of each piece of trust information.

11. The destination node according to claim 7 wherein each linear combination is done by means of an "Exclusive-OR" type operation.

* * * * *

UNITED STATES PATENT AND TRADEMARK OFFICE
CERTIFICATE OF CORRECTION

PATENT NO. : 8,532,143 B2  
APPLICATION NO. : 12/940243  
DATED : September 10, 2013  
INVENTOR(S) : Mounir Achir It is certified that error appears in the above-identified patent and that said Letters Patent is hereby corrected as shown below:

ON THE TITLE PAGE:

Item (73), Assignee:
"Canon Kabushikia Kaisha" should read --Canon Kabushiki Kaisha--.

Signed and Sealed this
Twenty-fifth Day of March, 2014

Michelle K. Lee
*Deputy Director of the United States Patent and Trademark Office*